United States Patent

Shang et al.

[11] Patent Number: 5,788,778
[45] Date of Patent: Aug. 4, 1998

[54] DEPOSITION CHAMBER CLEANING TECHNIQUE USING A HIGH POWER REMOTE EXCITATION SOURCE

[75] Inventors: Quanyuan Shang, San Jose; Kam S. Law, Union City; Dan Maydan, Los Altos Hills, all of Calif.

[73] Assignee: Applied Komatsu Technology, Inc., Tokyo, Japan

[21] Appl. No.: 707,491

[22] Filed: Sep. 16, 1996

[51] Int. Cl.⁶ .................. B08B 7/04; B08B 5/00; C03C 23/06; C03C 15/00

[52] U.S. Cl. .................. 134/1; 134/2; 134/31; 134/37; 134/21; 156/345; 156/643.1; 156/646.1; 156/657.1

[58] Field of Search .................. 134/1, 2, 3, 11, 134/30, 902, 37; 156/643.1, 646.1, 656.1, 657.1, 345

[56] References Cited

FOREIGN PATENT DOCUMENTS

| 0697467 | 2/1996 | European Pat. Off. |
| 4132559 | 4/1993 | Germany. |
| WO 96/15545 | 5/1996 | WIPO. |

Primary Examiner—Ponnathapura Achutamurthy
Assistant Examiner—Padmashri Ponnaluri
Attorney, Agent, or Firm—Fish & Richardson P.C.

[57] ABSTRACT

A method for cleaning a deposition chamber that is used in fabricating electronic devices including the steps of delivering a precursor gas into a remote chamber that is outside of the deposition chamber, activating the precursor gas in the remote chamber via a high power source to form a reactive species, flowing the reactive species from the remote chamber into the deposition chamber, and using the reactive species that is flowed into the deposition chamber from the remote chamber to clean the inside of the deposition chamber.

21 Claims, 2 Drawing Sheets

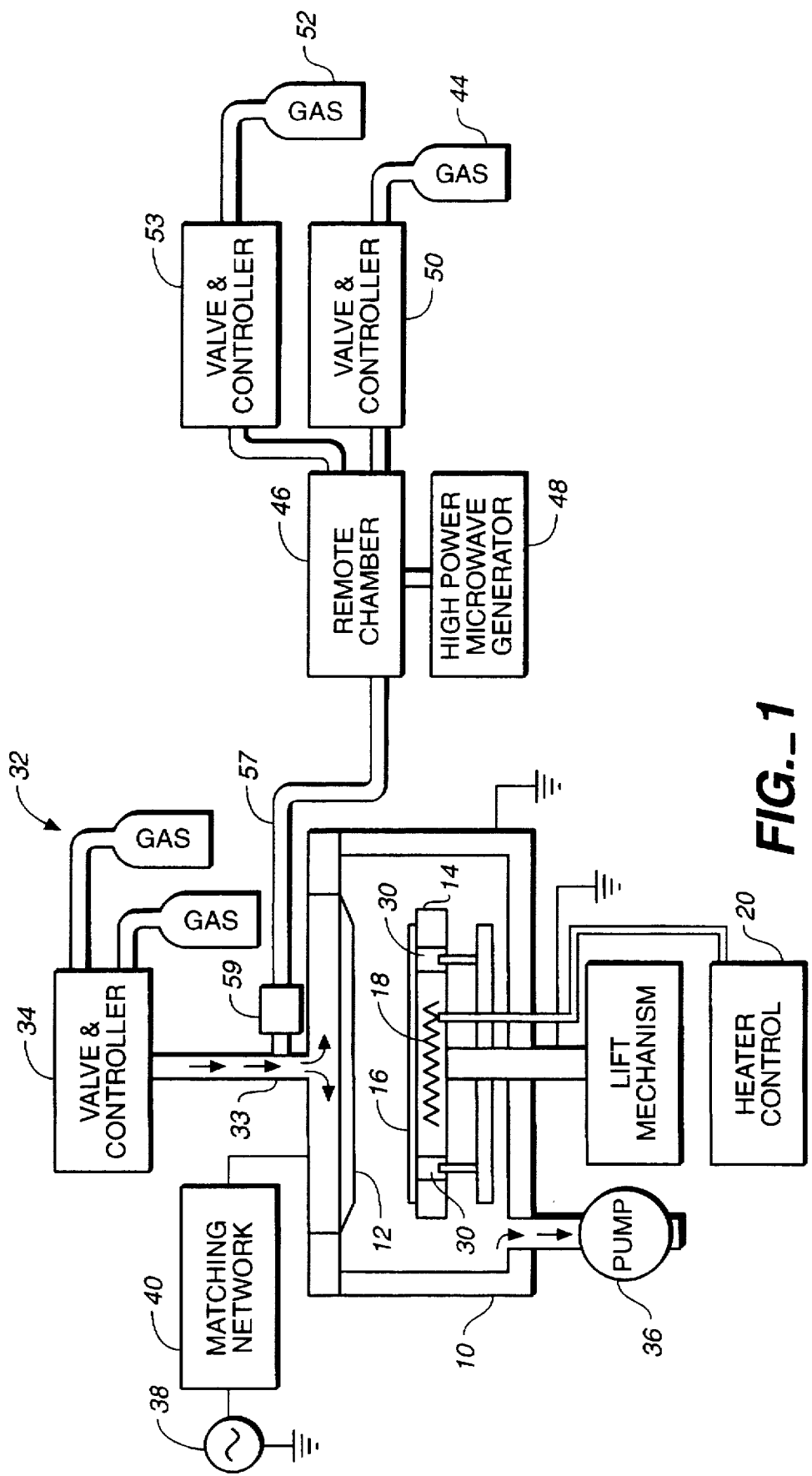
FIG._1

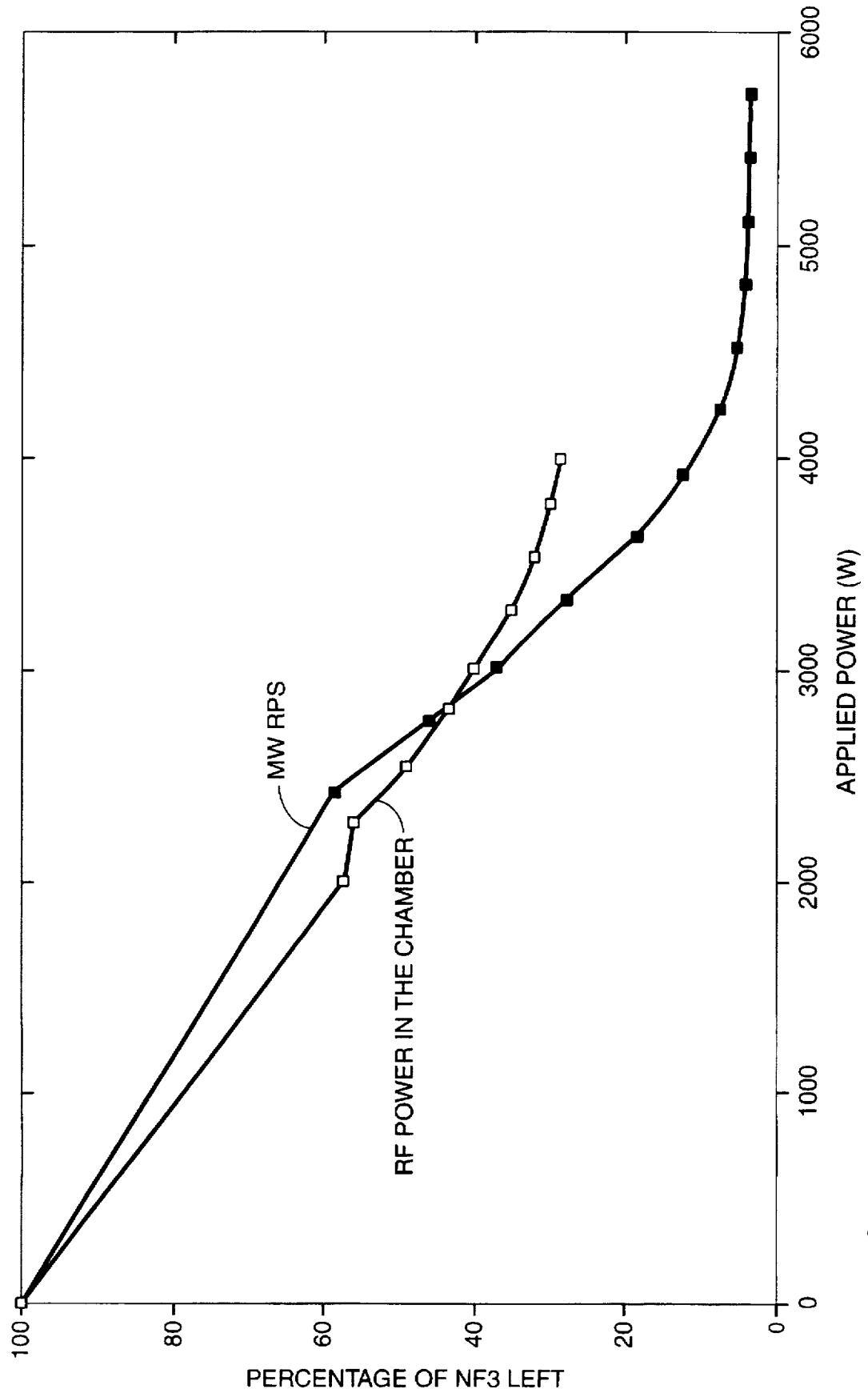
FIG._2

DEPOSITION CHAMBER CLEANING TECHNIQUE USING A HIGH POWER REMOTE EXCITATION SOURCE

BACKGROUND OF THE INVENTION

Plasma assisted chemical reactions have been widely used in the semiconductor and flat panel display industries. One example is plasma-enhanced chemical vapor deposition (PECVD), which is a process that is used in the manufacture of thin film transistors (TFT) for active-matrix liquid crystal displays (AMLCDs). In accordance with PECVD, a substrate is placed in a vacuum deposition chamber that is equipped with a pair of parallel plate electrodes. One of the electrodes, e.g. the lower electrode, generally referred to as a susceptor, holds the substrate. The other electrode, i.e., the upper electrode, functions as a gas inlet manifold or shower head. During deposition, a reactant gas flow into the chamber through the upper electrode and a radio frequency (RF) voltage is applied between the electrodes to produce a plasma within the reactant gas. The plasma causes the reactant gas to decompose and deposit a layer of material onto the surface of the substrate.

Though such systems are designed to preferentially deposit the material onto the surface of the substrate, they also deposit some material onto other interior surfaces within the chamber. Consequently, after repeated use, these systems must be cleaned to remove the deposited layer of material that has built up in the chamber. To clean the chamber and the exposed components within the chamber, an in-situ dry cleaning process is commonly used. According to the in-situ technique, precursor gases are supplied to the chamber. Then, by locally applying a glow discharge plasma to the precursor gases within the chamber, reactive species are generated. The reactive species clean the chamber surfaces by forming volatile compounds with the process deposit on those surfaces.

This in-situ cleaning technique has several disadvantages. First, it is inefficient to use a plasma within the chamber to generate the reactive species. Thus, it is necessary to use relatively high powers to achieve an acceptable cleaning rate. The high power levels, however, tend to produce damage to the hardware inside of the chamber thereby significantly shortening its useful life. Since the replacement of the damaged hardware can be quite costly, this can significantly increase the per substrate cost of product that is processed using the deposition system. In the current, highly competitive semiconductor fabrication industry where per substrate costs are critical to the cost conscious purchasers, the increased operating costs resulting from having to periodically replace parts that are damaged during the cleaning process is very undesirable.

Another problem with the conventional in-situ dry cleaning processes is that the high power levels required to achieve acceptable cleaning rates also tend to generate residues or byproducts that can damage other system components or which cannot be removed except by physically wiping off the internal surfaces of the chamber. As an example, in a deposition system in which the chamber or the process kit components (e.g. heater, shower head, clamping rings, etc.) are made of aluminum, an $NF_3$ plasma is often used to clean the interior surfaces. During the cleaning process, a certain amount of $Al_xF_y$ is formed. The amount that is formed is greatly increased by the ion bombardment that results from the high plasma energy levels. Thus, a considerable amount of $Al_xF_y$ can be formed in the system. Unfortunately, this material cannot be etched away by any known chemical process, so it must be removed by physically wiping the surfaces.

One solution is to excite the plasma in a remote chamber. In this method, a remote excitation source is used outside of the process chamber to generate a reactive species. This species is supplied to the process chamber to assist in carrying out a particular process, e.g. dry cleaning the chamber.

This method has several drawbacks. First, the value of the applied plasma power used in such systems (typically 500–1500 watts) does not achieve complete breakdown of the feed gas, typically $NF_3$. The feed gas which is not broken down by the plasma may have adverse environmental impacts when the same is pumped out of the system. Purchasers often prefer products whose impact on the environment is either negligible or helpful.

Second, the value of the applied pressure used in such systems is generally low. The effect of this is that the plasma is less localized. An undesirable result of the lack of localization is that certain components in and near the remote excitation chamber may become burned by the hot plasma. For example, this may occur near the neck of the tube connecting the remote chamber to the deposition chamber, particularly on the side of the tube near the remote chamber.

Third, the initiation of a plasma with a microwave energy having the value of power used in such systems (typically 500–1500 watts) typically requires a complicated automatic tuning procedure because such plasmas are not stable otherwise. That is, such plasmas will extinguish without automatic tuning.

SUMMARY OF THE INVENTION

In one aspect, the invention concerns a method for cleaning a deposition chamber that is used in fabricating electronic devices. Steps in the method include delivering a precursor gas into a remote chamber that is outside of the deposition chamber and activating the precursor gas in the remote chamber to form a reactive species using a power of from about 3,000 Watts to about 12,000 Watts. Other steps include flowing the reactive species from the remote chamber into the deposition chamber and using the reactive species that is flowed into the deposition chamber from the remote chamber to clean the inside of the deposition chamber.

Implementations of the method include the following. The step of activating the precursor gas is performed by using a remote activation source. The precursor gas is selected from the group of gases consisting of all halogens and gaseous compounds thereof, and may be selected from the group of gases consisting of chlorine, fluorine, and gaseous compounds thereof. The remote activation source is a microwave energy source. The method may further include flowing a carrier gas into the remote activation chamber, where the carrier gas is selected from the group of gases consisting of nitrogen, argon, helium, hydrogen, and oxygen.

In another aspect, the invention is directed to a method of cleaning a process chamber. Steps of the method include delivering a precursor gas into a remote chamber that is outside of the process chamber so that there is a pressure differential between the remote chamber and the process chamber and activating the precursor gas in the remote chamber to form a reactive species using a power of from about 3,000 Watts to about 12,000 Watts. Other steps include flowing the reactive species from the remote chamber into the process chamber.

Implementations of the invention include the following. A step may be included of using a local activation source to further excite the reactive species that has been flowed into the process chamber from the remote chamber, and using the reactive species that has been further excited by the local activation source to perform the cleaning process in the process chamber. The pressure differential is at least about 4.5 Torr, and the pressure in the remote chamber is at least about 15 Torr.

In another aspect, the invention is directed to a deposition apparatus that can be connected to a source of precursor gas for cleaning. The apparatus includes a deposition chamber, a remote chamber that is outside of the deposition chamber, an high power activation source adapted to deliver energy of a high power into the remote chamber, a first conduit for flowing a precursor gas from a remote gas supply into the remote chamber where it is activated by the activation source to form a reactive species, and a second conduit for flowing the reactive species from the remote chamber into the deposition chamber.

Implementations of the invention include the following. The apparatus may include a valve and flow control mechanism which controls the flow of precursor gas into the remote chamber, and a valve and flow control mechanism which controls the flow of a carrier gas that is different from the precursor gas into the remote chamber.

In a further aspect, the invention is directed to a method for cleaning a deposition chamber that is used in fabricating electronic devices. Steps of the method include delivering a precursor gas into a remote chamber that is outside of the deposition chamber and activating the precursor gas in the remote chamber to form a reactive species using a power of from about 12,000 Watts per liter to about 48,000 Watts per liter of remote chamber volume. Other steps include flowing the reactive species from the remote chamber into the deposition chamber and using the reactive species that is flowed into the deposition chamber from the remote chamber to clean the inside of the deposition chamber.

In a further aspect, the invention is directed to a method for cleaning a deposition chamber that is used in fabricating electronic devices. The method includes steps of delivering a precursor gas into a remote chamber that is outside of the deposition chamber and activating the precursor gas in the remote chamber to form a reactive species using a power of from about 3,000 Watts to about 12,000 Watts using a fixed tuning high power plasma source. Other steps include flowing the reactive species from the remote chamber into the deposition chamber, and using the reactive species that is flowed into the deposition chamber from the remote chamber to clean the inside of the deposition chamber.

BRIEF DESCRIPTION OF THE DRAWINGS

FIG. 1 shows a block diagram of a high power PECVD system which embodies the invention.

FIG. 2 shows a graph of a percentage amount of cleaning gas breakdown versus applied power.

DESCRIPTION OF THE PREFERRED EMBODIMENTS

In the described embodiment, we used a model AKT-1600 PECVD System manufactured by Applied Komatsu Technology, modified as described herein. The AKT-1600 PECVD is designed for use in the production of active-matrix liquid crystal displays (AMLCDs). It is a modular system with multiple process chambers which can be used for depositing amorphous silicon, silicon nitride, silicon oxide and oxynitride films. The invention, however, may be used with any commercially available deposition system.

Referring to FIG. 1, the PECVD system modified in accordance with invention includes a deposition chamber 10 inside of which is a gas inlet manifold (or shower head) 12 for introducing deposition gases and a susceptor 14 for holding a substrate 16 onto which material is to be deposited. Inlet manifold 12 and susceptor 14, which are both in the form of parallel plates, also function as upper and lower electrodes, respectively. The lower electrode and the chamber body are connected to ground. An RF generator 38 supplies RF power to the upper electrode through a matching network 40. RF generator 38 is used to generate a plasma between the upper and lower electrodes.

Susceptor 14 includes a resistive heater 18 for heating the substrate during deposition. An external heater control module 20 powers the heaters to achieve and maintain the susceptor at an appropriate temperature level as dictated by the process being run in the system.

Outside of chamber 10, there is a gas supply 32 containing the gases that are used during deposition. The particular gases that are used depend upon the materials are to be deposited onto the substrate. The process gases flow through an inlet port into the gas manifold and then into the chamber through the shower head. An electronically operated valve and flow control mechanism 34 controls the flow of gases from the gas supply into the chamber. Also connected to the chamber through an outlet port is a vacuum pump 36, which is used to evacuate the chamber.

In accordance with the invention, a second gas supply system is also connected to the chamber through inlet port 33. The second gas supply system supplies gas that is used to clean the inside of the chamber after a sequence of deposition runs. By cleaning, we mean removing deposited material from the interior surfaces of the chamber. One may also combine the first and second gas supplies if the gases are such that mixing is desired.

The second gas supply system includes a source of a precursor gas 44, a remote activation chamber 46 which is located outside and at a distance from the deposition chamber, a power source 48 for activating the precursor gas within the remote activation chamber, an electronically operated valve and flow control mechanism 50 and a conduit or pipe 57 connecting the remote chamber to the deposition chamber.

A flow restrictor 59 is employed in pipe 57. Flow restrictor 59 may be placed anywhere in the path between remote chamber 46 and deposition chamber 10. Such a flow restrictor allows a pressure differential to be present between remote chamber 46 and deposition chamber 10.

The valve and flow control mechanism 50 delivers gas from the source of precursor gas 44 into the remote activation chamber 46 at a user-selected flow rate. The power source 48 activates the precursor gas to form a reactive species which is then flowed through the conduit 57 into the deposition chamber via inlet port 33. In other words, the upper electrode or shower head 12 is used to deliver the reactive gas into the deposition chamber. In the described embodiment, the remote chamber is a sapphire tube and the power source is 2.54 GHz microwave energy with its output aimed at the sapphire tube.

Optionally, there may also be a source of a minor carrier gas 52 that is connected to the remote activation chamber through another valve and flow control mechanism 53. The minor carrier gas aids in the transport of the activated species to the deposition chamber. It can be any appropriate nonreactive gas that is compatible with the particular cleaning process with which it is being used. For example, the minor carrier gas may be argon, nitrogen, helium, hydrogen, or oxygen, etc. In addition to aiding in the transport of activated species to the deposition chamber, the carrier gas may also assist in the cleaning process or help initiate and/or stabilize the plasma in the deposition chamber.

In the described embodiment, the precursor gas is $NF_3$. The flow rate of activated species is about 2 liters per minute and the process chamber pressure is about 0.5 Torr. To activate the precursor gas, the microwave source delivers about 3,000–12,000 Watts to the remote activation chamber. A value of 5,000 Watts may be used for many applications.

The remote activation chamber is held at a pressure which is as high as feasible. In other words, the pressure differential between the remote chamber and the deposition chamber may be made as large as possible and may be at least, e.g., 4.5 Torr. The pressure in the remote chamber may be higher, for example, about 5 Torr to about 20 Torr, and in particular may be about 15 Torr. The pressure in the deposition chamber may be, for example, about 0.1 Torr to about 2 Torr, and in particular about 0.5 Torr. Flow restrictor 59 is employed to allow a high pressure plasma to be maintained without detrimentally affecting the pressure of deposition chamber 10. Flow restrictor 59 may be, for example, a small orifice or a series of small orifices, although any device that creates a pressure differential, such as a reduction valve or a needle valve, could be employed. Flow restrictor 59 may be placed at or near the point at which pipe 57 enters deposition chamber 10.

This choice of power and pressure for the remote chamber has several advantages. First, the high power chosen causes a practically complete activation of gases in the remote chamber, resulting in a lesser amount of precursor gases pumped out of the chamber which have adverse environmental impacts.

Second, the inventors have discovered that the percentage amount of activation is far greater than would be expected. Referring to FIG. 2, the percentage of gas breakdown (or activated gases) is shown graphed versus applied power at a pressure of 15 Torr. With a different scaling, the curve would appear much the same for the cleaning rate. As can be seen at low power, the gas breakdown is approximately linear. The inventors have discovered that at high power, such as above 2,000 Watts, the gas breakdown percentage goes through a nonlinear transitional section before asymptotically approaching 100% breakdown. This is seen in the curve having filled-in data points which is denoted MW RPS (microwave remote power source). This results in far greater gas breakdown than expected. It should be noted that the precise position of the transitional region also depends on factors such as gas pressure and gas flow.

The power ranges discussed above may be considered to be partly dependent on the size of the remote chamber. A power range of about 3,000–12,000 Watts is based on a remote chamber volume of ¼ liter and corresponds to a power density of about 12,000–48,000 Watts/liter. These values scale both up and down for chambers of other sizes.

A third reason why the power and pressure ranges are advantageous is that the high pressure plasma is more localized. Therefore, the high pressure plasma may be less likely to diffuse out of the remote chamber and cause burning, particularly of the piping connecting the remote chamber to the deposition chamber.

A fourth reason why the power and pressure ranges are advantageous is the plasma stability. High power microwave plasmas are more stable than low power plasmas and are easier to tune. For example, low power plasmas require a complicated automatic tuning procedure during the initiation of the plasma. If this is not used, the low power plasma will extinguish. If high power is used to initiate the plasma, an easier fixed tuning procedure may be used for both initiation and optimized tuning.

Therefore, the combination of a high power and high pressure plasma in the remote plasma activation chamber leads to an unexpectedly efficient, localized and stable plasma.

By using $NF_3$ as the feed gas, we have been able to clean chambers that have been deposited with silicon (Si), doped silicon, silicon nitride ($Si_3N_4$) and silicon oxide ($SiO_2$). The cleaning rate for as-deposited film has reached 1 micron/ minute for silicon nitride (flowing 2,000 sccm of $NF_3$ at a remote chamber pressure of 15 Torr, a remote chamber power of 5,000 Watts and a susceptor temperature of 360° C.) and 1 micron/minute for, e.g., silicon nitride. These cleaning rates are faster, e.g., twice as fast, than the conventional cleaning process which employs only a local plasma with a power level of about 3 kilowatts at 13.56 MHz RF.

In general, the reactive gases may be selected from a wide range of options, including the commonly used halogens and halogen compounds. For example, the reactive gas may be chlorine, fluorine or compounds thereof, e.g. $NF_3$, $CF_4$, $SF_6$, $C_2F6$, $CCl_4$, $C_2Cl_6$. Of course, the particular gas that is used depends on the deposited material which is being removed. For example, in a tungsten deposition system a fluorine compound gas is typically used to etch and/or remove clean the deposited tungsten.

It should be understood that the power levels, flow rates, and pressures that are chosen are system specific and thus they will need to be optimized for the particular system in which the process is being run. Making the appropriate adjustments in process conditions to achieve optimum of performance for a particular system is well within the capabilities of a person of ordinary skill in the art.

Although the described embodiment involved a PECVD system, the invention has far wider applicability. For example, the concept of a remote activation source (i.e., outside the main vacuum chamber), possibly used in conjunction with a local activation source (i.e., inside the main vacuum chamber) can be used in systems designed for any of the following purposes: PVD, CVD, ion doping, photoresist stripping, substrate cleaning, plasma etching.

Other embodiments are within the following claims.

What is claimed is:

1. A method for cleaning a deposition chamber that is used in fabricating electronic devices, said method comprising:

delivering a precursor gas into a remote chamber that is outside of the deposition chamber;

activating the precursor gas in the remote chamber to form a reactive species using power from about 3,000 Watts to 12,000 Watts;

flowing the reactive species from the remote chamber into the deposition chamber; and using the reactive species that is flowed into the deposition chamber from the remote chamber to clean the inside of the deposition chamber.

2. The method of claim 1 wherein the step of activating the precursor gas is performed by using a remote activation source.

3. The method of claim 2 wherein the precursor gas is selected from the group of gases consisting of all halogens and gaseous compounds thereof.

4. The method of claim 3 wherein the precursor gas is selected from the group of gases consisting of chlorine, fluorine, and gaseous compounds thereof.

5. The method of claim 4 wherein the precursor gas is $NF_3$.

6. The method of claim 2 wherein the remote activation source is a microwave energy source.

7. The method of claim 2 further comprising flowing a carrier gas into the remote activation chamber.

8. The method of claim 7 wherein the carrier gas is selected from the group of gases consisting of nitrogen, argon, helium, hydrogen, and oxygen.

9. A method of cleaning a process chamber, said method comprising:
   delivering a precursor gas into a remote chamber that is outside of the process chamber so that there is a pressure differential between said remote chamber and said process chamber;
   activating the precursor gas in the remote chamber and to thereby form a reactive species using power from about 3,000 Watts to 12,000 Watts;
   flowing the reactive species from the remote chamber into the process chamber.

10. The method of claims 1 or 9, further comprising the step of:
    using a local activation source to further excite the reactive species that has been flowed into the process chamber from the remote chamber; and
    using the reactive species that has been further excited by the local activation source in performing the cleaning process in the process chamber.

11. The method of claim 9, wherein said pressure differential is at least 4.5 Torr.

12. The method of claim 9, wherein the pressure in the remote chamber is between 5 Torr and 20 Torr.

13. The method of claim 12, wherein the pressure in the remote chamber is at least about 15 Torr.

14. A deposition apparatus assembly, comprising:
    a deposition chamber;
    a remote chamber that is outside of said deposition chamber;
    an activation source adapted to deliver energy into said remote chamber;
    a first conduit for flowing a precursor gas from a remote gas supply into the remote chamber where it is activated by said activation source to form a reactive species;
    a second conduit for flowing the reactive species from the remote chamber into the deposition chamber; and
    a flow restrictor placed within the second conduit, whereby a pressure differential is created between said remote chamber and said deposition chamber.

15. The assembly of claim 14 further comprising a valve and flow control mechanism which controls the flow of precursor gas into the remote chamber.

16. The assembly of claim 14 wherein said flow restrictor is a reduction valve.

17. The assembly of claim 14 wherein said activation source is designed to deliver energy in a power range from about 12,000 Watts per liter to 48,000 Watts per liter.

18. The apparatus of claim 14 further comprising a valve and flow control mechanism which controls the flow of a carrier gas that is different from the precursor gas into the remote chamber.

19. A method for cleaning a deposition chamber that is used in fabricating electronic devices, said method comprising:
    delivering a precursor gas into a remote chamber that is outside of the deposition chamber;
    activating the precursor gas in the remote chamber to form a reactive species using power from about 12,000 Watts per liter to 48,000 Watts per liter of remote chamber volume;
    flowing the reactive species from the remote chamber into the deposition chamber under a pressure differential; and
    using the reactive species that is flowed into the deposition chamber from the remote chamber to clean the inside of the deposition chamber.

20. The method of claim 19, wherein the pressure differential is at least about 4.5 Torr.

21. A method for cleaning a deposition chamber that is used in fabricating electronic devices, said method comprising:
    delivering a precursor gas into a remote chamber that is outside of the deposition chamber;
    activating the precursor gas in the remote chamber to form a reactive species using power from about 3,000 Watts to 12,000 Watts using a fixed tuning high power plasma source;
    flowing the reactive species from the remote chamber into the deposition chamber; and
    using the reactive species that is flowed into the deposition chamber from the remote chamber to clean the inside of the deposition chamber.

* * * * *